US008853536B2

(12) United States Patent
Kim

(10) Patent No.: US 8,853,536 B2
(45) Date of Patent: Oct. 7, 2014

(54) SOLDERABLE ELASTIC ELECTRIC CONTACT TERMINAL

(75) Inventor: Sun-Ki Kim, Kyeonggi-do (KR)

(73) Assignees: Joiset Co., Ltd (KR); Sun-Ki Kim (KR)

( * ) Notice: Subject to any disclaimer, the term of this patent is extended or adjusted under 35 U.S.C. 154(b) by 175 days.

(21) Appl. No.: 13/490,519

(22) Filed: Jun. 7, 2012

(65) Prior Publication Data

US 2012/0322279 A1 Dec. 20, 2012

(30) Foreign Application Priority Data

Jun. 15, 2011 (KR) ........................ 10-2011-0057929

(51) Int. Cl.
*H05K 9/00* (2006.01)

(52) U.S. Cl.
USPC .................................. 174/68.1; 174/120 AR

(58) Field of Classification Search
USPC ............. 174/35 R, 35 GC, 52.1, 68.1, 89, 93, 174/117 F, 153 G, 115, 105 R, 110 R, 113 R, 174/106 R, 110 AR, 120 AR; 439/65, 66, 47, 439/83
See application file for complete search history.

(56) References Cited

U.S. PATENT DOCUMENTS 7,931,475 B2 4/2011 Kim et al.
2006/0162287 A1* 7/2006 Hasegawa ....................... 53/362
2011/0266031 A1* 11/2011 Kim ........................... 174/126.2

FOREIGN PATENT DOCUMENTS

KR 20030095312 * 12/2003 ............... H05K 9/00
KR 10-0839893 B 6/2008
KR 10-2010-0057421 A 5/2010
KR 10-2010-0124148 A 11/2010
KR 10-1001354 B 12/2010

* cited by examiner

*Primary Examiner* — Jenny L Wagner
*Assistant Examiner* — Michael E Moats, Jr.
(74) *Attorney, Agent, or Firm* — Park & Associates IP Law, P.C.

(57) ABSTRACT

Provided is a solderable elastic electric contact terminal, which includes an elastic core having a height smaller than a width thereof, and including two or more through holes separately disposed therein and having a dumbbell shaped cross section, wherein the through holes extend along a longitudinal direction of the elastic core, an elastic rubber coating layer enveloping the elastic core to adhere thereto, and a heat-resistant polymer film having a surface adhered to the elastic rubber coating layer to envelop the elastic rubber coating layer, and another surface integrally formed with a metal layer. A top surface of the metal layer is horizontal for vacuum pickup.

10 Claims, 2 Drawing Sheets

SOLDERABLE ELASTIC ELECTRIC CONTACT TERMINAL

REFERENCE TO RELATED APPLICATIONS

This application claims the priority benefit of Korean Patent Application No. 10-2011-0057929 filed on Jun. 15, 2011, the entire contents of which are incorporated herein by reference.

FIELD OF THE INVENTION

The present invention relates to a solderable elastic electric contact terminal, and more particularly, to a solderable elastic electric contact terminal having excellent elastic resilient force and a height smaller than the width thereof, which is appropriate for surface mounting and reflow soldering.

BACKGROUND OF THE INVENTION

Elastic electric contact terminals are used to electrically and elastically connect electrically conductive objects and conductive patterns of a printed circuit board (PCB) in a state where the electrically conductive objects and the conductive patterns are individually provided, or face each other.

Such elastic electric contact terminals may be used as electric connecting terminals, ground connecting terminals, and electromagnetic interference (EMI) shield members.

To this end, elastic electric contact terminals may be required to have excellent electrical conductivity and high elastic resilient force, and to uniformly disperse pressure applied thereto. In addition, elastic electric contact terminals may be required to have low electrical contact resistance with an object, and be installed thereon reliably and economically. To this end, a surface mounting process using vacuum pickup, and a reflow soldering process using solder cream may be sequentially performed to install elastic electric contact terminals on a conductive pattern of a PCB A solderable elastic electric contact terminal is disclosed in Korean Patent Registration No. 10-1001354 applied by the applicant of the present invention, in which a non-foaming elastic core includes a through hole along the longitudinal direction thereof to appropriately and elastically resist pressure applied from the upper side thereof.

However, when the height of the solderable elastic electric contact terminal is significantly smaller than the width thereof, for example, the solderable elastic electric contact terminal has a width of 2.5 mm or smaller, and a height of 1 mm or smaller, the following problems may occur.

First, the through hole has an oval shape with a large width-to-height ratio, in order to decrease pressure applied to the elastic core and increase the resilient force thereof. In this case, the elastic core may sags, which jeopardizes flatness of the top thereof for vacuum pickup, and decreases force for entirely supporting the elastic electric contact terminal so as to decrease the resilient force thereof.

In addition, since the through hole has a large width-to-height ratio, when pressure is applied to the elastic core from the upper side thereof, the laterally middle portion of the elastic core is recessed more easily than both side portions thereof are, thus degrading contact efficiency between the elastic electric contact terminal and an object.

In addition, it may be difficult to massively produce bilateral symmetric elastic cores having a through hole with a large width-to-height ratio.

In addition, when the elastic core having a through hole with a large width-to-height ratio is heated and pressed from the upper side thereof, that is, when a reliability test is performed thereon, the top and bottom walls of the elastic core defining the through hole may be adhered to each other.

SUMMARY OF THE INVENTION

An object of the present invention is to provide an elastic electric contact terminal having a height smaller than the width thereof, in which through holes can be easily formed.

Another object of the present invention is to provide an elastic electric contact terminal having through holes, the upper and bottom walls of which are prevented from being adhered to each other even when the elastic electric contact terminal is maximally and vertically pressed, and then, is heated.

Another object of the present invention is to provide an elastic electric contact terminal that uniformly disperses pressure vertically applied from an object.

Another object of the present invention is to provide an elastic electric contact terminal, which is appropriate for reflow soldering and reel taping using vacuum pickup, and which increases soldering strength.

Another object of the present invention is to provide an elastic electric contact terminal having excellent vertical elastic resilient force and a height smaller than the width thereof.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Figure 1:
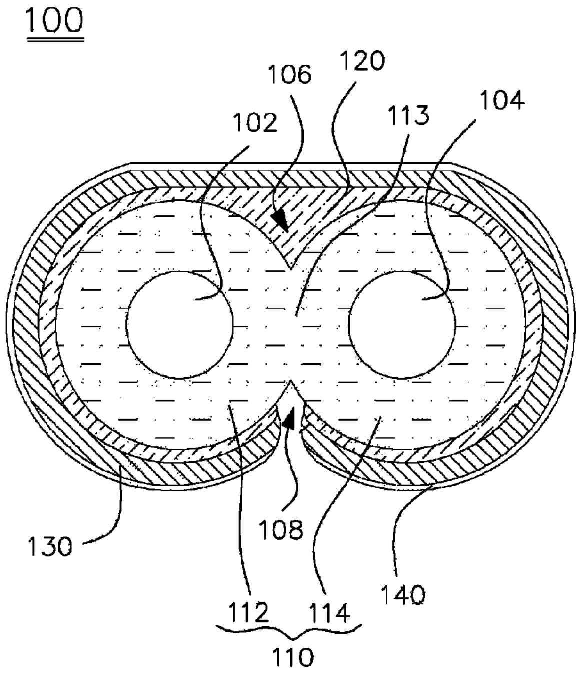
FIG. 1 is a cross-sectional view illustrating an elastic electric contact terminal according to an embodiment of the present invention.

According to an aspect of the present invention, there is provided a solderable elastic electric contact terminal including: an elastic core having a height smaller than a width thereof, and including two or more through holes separately disposed therein and having a dumbbell shaped cross section, wherein the through holes extend along a longitudinal direction of the elastic core; an elastic rubber coating layer enveloping the elastic core to adhere thereto; and a heat-resistant polymer film having a surface adhered to the elastic rubber coating layer to envelop the elastic rubber coating layer, and another surface integrally formed with a metal layer, wherein a top surface of the metal layer is horizontal for vacuum pickup.

According to another aspect of the present invention, there is provided a solderable elastic electric contact terminal including: an elastic core having a height smaller than a width thereof, and including two or more through holes separately disposed therein, wherein the through holes extend along a longitudinal direction of the elastic core; an electrically conductive elastic rubber coating layer enveloping the elastic core to adhere thereto; and a metal foil adhered to a bottom surface of the electrically conductive elastic rubber coating layer by curing the electrically conductive elastic rubber coating layer, wherein a top surface of the elastic rubber coating layer is horizontal for vacuum pickup.

The elastic core may include elastic core elements having the same shape and size, which are integrally formed and include through holes, respectively.

The through hole may have a circular shape, and the elastic core may have a dumbbell shape.

A recess may be disposed in an upper boundary between the elastic cores.

A low recess may be disposed in a lower boundary between the elastic core elements, and the low recess may have a space that is not covered with the elastic rubber coating layer and the heat-resistant polymer film.

The elastic core elements may include bottom parts, respectively, to form a bilateral symmetric protrusion structure to contact solder cream of a printed circuit board.

The elastic core may be formed of silicone rubber.

The solderable elastic electric contact terminal may be appropriate for surface mounting using vacuum pickup, and reflow soldering using solder cream.

The elastic rubber coating layer may be formed by curing a silicone rubber liquid.

The heat-resistant polymer film integrally formed with the metal layer may be formed by at least plating a polyethylene terephthalate or polyimide film plated with a metal layer.

The electrically conductive elastic rubber coating layer may be formed by curing an electrically conductive silicone rubber liquid.

The electrically conductive elastic rubber coating layer may have portions extending a certain length from both bottom edges of the elastic core, and the metal foil may be adhered to the extended portions of the electrically conductive elastic rubber coating layer.

A portion of a bottom surface of the elastic core out of the extended portions between the elastic core and the metal foil may be filled with and adhered to an elastic rubber adhesive.

Embodiments of the present invention will be described below in more detail with reference to the accompanying drawings.

FIG. 1 is a cross-sectional view illustrating an elastic electric contact terminal 100 according to an embodiment of the present invention.

The elastic electric contact terminal 100 includes: an elastic rubber member 110 including through holes 102 and 104 therein, extending along the longitudinal direction thereof; an elastic rubber coating layer 120 enveloping the elastic rubber member 110 to adhere thereto; and a heat-resistant polymer film 130 having a surface adhered to the elastic rubber coating layer 120 to envelop the elastic rubber coating layer 120, and another surface integrally formed with a metal layer 140.

Referring to FIG. 1, the elastic rubber member 110 includes elastic rubber elements 112 and 114 that are integrally connected to each other to form an approximately dumbbell-shaped vertical cross section. However, the vertical cross section of the elastic rubber member 110 is not limited to a dumbbell shape. In other words, the elastic rubber member 110 may include three or more elastic rubber elements integrally connected to one another, each of which may have a cross section different from a circular shape. Thus, the vertical cross section of the elastic rubber member 110 is not limited to a dumbbell shape.

Thus, the elastic rubber member 110 may have any structure including two or more through holes therein, and having a height smaller than the width thereof.

As such, since the through holes 102 and 104 are separately formed in the elastic rubber elements 112 and 114, although the height of the elastic rubber member 110 is smaller than the width thereof, the through holes 102 and 104 can be efficiently formed.

In addition, since the through holes 102 and 104 are separately formed in the elastic rubber elements 112 and 114, when the elastic electric contact terminal 100 is maximally pressed, and then, is heated, the possibility of adhesion between the top and bottom walls of the elastic rubber member 110 defining the through holes 102 and 104 is lower than the possibility of adhesion between the top and bottom walls of an elastic rubber member defining a single through hole.

In addition, since a plurality of the through holes 102 and 104 are formed in the elastic rubber member 110, the pressure applied from an object to the elastic rubber member 110 is uniformly dispersed, and resilient force of the elastic rubber member 110 corresponding to the through hole 102 is combined with resilient force thereof corresponding to the through hole 104, to thereby increase the entire resilient force thereof.

In addition, since the elastic rubber elements 112 and 114 are integrated into the elastic rubber member 110, it is easy to form the elastic rubber member 110 to bilateral symmetric shape and size.

A support part 113 is disposed between the elastic rubber elements 112 and 114 resists pressure applied from the upper side thereof, and includes an upper recess 106 and a lower recess 108.

Thus, although the height of the elastic rubber member 110 is smaller than the width thereof, the elastic rubber member 110 can sufficiently resist external vertical pressure, and has excellent elastic resilient force.

For example, the elastic rubber member 110 and the elastic rubber coating layer 120 may be formed of an electrically insulated and non-foaming material.

The elastic rubber member 110 may be formed through a single extrusion process. The through holes 102 and 104 may be bilaterally symmetric to each other in terms of size and shape. For example, the through holes 102 and 104 may have a size ranging from about 0.3 mm to about 4 mm.

A top surface of the elastic rubber coating layer 120 corresponding to the upper portion of the support part 113 may be horizontal. To this end, the upper recess 106 is completely filled with an elastic rubber coating liquid, and the elastic rubber coating liquid is cured. As a result, the top surface of the elastic electric contact terminal 100 is also horizontal that is appropriate for vacuum pickup.

The lower recess 108 of the support part 113 may have a space that is not covered with the elastic rubber coating layer 120 and the heat-resistant polymer film 130, and the space receives a remainder of the elastic rubber coating liquid forming the elastic rubber coating layer 120 between the heat-resistant polymer film 130 and the elastic rubber elements 112 and 114.

When the elastic rubber elements 112 and 114 have circular cross sections, the elastic rubber elements 112 and 114 include bottom parts **112*a* and 114*a* that are placed on solder cream of a printed circuit board. The bottom parts 112*a* and 114*a*** form a bilateral symmetric protrusion structure that is efficiently immobilized during reflow soldering, thereby improving the reliability of soldering.

The elastic rubber coating layer 120 is disposed between the elastic rubber member 110 and the heat-resistant polymer film 130 to reliably and elastically adhere the elastic rubber member 110 and the heat-resistant polymer film 130 to each other.

For example, the elastic rubber coating layer 120 may be a non-foaming insulation silicone rubber adhesive that has elastic and self-adhesive characteristics so as to adhere to the elastic rubber member 110 and the heat-resistant polymer film 130 after curing.

After the curing, the elastic rubber coating layer 120 is solidified, and has elasticity and thermosetting characteristics to keep the adhesiveness thereof against heat generated in a subsequent soldering process.

For example, the heat-resistant polymer film 130 may be a polyimide (PI) film having excellent heat resistance, but is not limited thereto, and thus may be a polyethylene terephthalate (PET) film. The outer surface of the heat-resistant polymer film 130 is integrally formed with the metal layer 140. For example, the metal layer 140 may have a small thickness through metal sputtering and metal plating, so as to improve the flexibility, elastic resilience, and soldering strength of the elastic electric contact terminal 100.

For example, the metal layer 140 may have a thickness of 0.005 mm or smaller, and an electric resistance of 1Ω or smaller, and the heat-resistant polymer film 130 may have a thickness of 0.05 mm or smaller.

For example, the metal layer 140 may be formed by performing a sputtering process using a metal on the heat-resistant polymer film 130 to form a sputtering layer, and plating the sputtering layer with a solderable metal. Accordingly, the metal layer 140 strongly adheres to the heat-resistant polymer film 130.

Furthermore, the metal layer 140 may include a plurality of metal layers. For example, at least one of the metal layers may be formed through copper plating, and function as a main layer of the metal layer 140, and the main layer may be plated with the other layers that are formed of one of stannum, silver, and gold to resist corrosion and facilitate soldering using solder cream.

Figure 2:
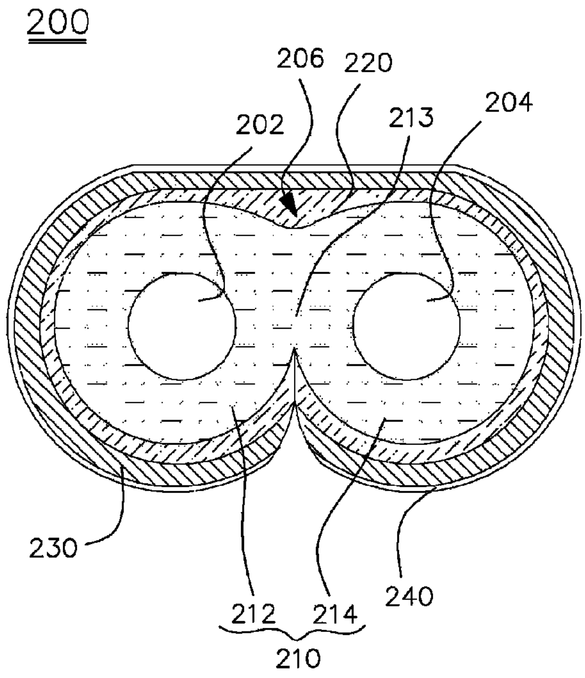
FIG. 2 is a cross-sectional view illustrating an elastic electric contact terminal according to another embodiment of the present invention.

FIG. 2 is a cross-sectional view illustrating an elastic electric contact terminal 200 according to another embodiment of the present invention.

As in the embodiment of FIG. 1, an elastic rubber member 210 includes a support part 213. When an elastic rubber coating layer 220 is formed, an upper recess of the support part 213 may be insufficiently filled with an elastic rubber coating liquid so as to form a hollow space.

Then, the elastic rubber coating liquid forming the elastic rubber coating layer 220 is enveloped with a heat-resistant polymer film 230. At this point, when the heat-resistant polymer film 230 is tightened, elastic rubber elements 212 and 214 are rolled in opposite directions to fill the hollow space with the elastic rubber coating liquid. Accordingly, the entire top surface of the elastic rubber member 210 becomes horizontal, and thus, the entire top surface of the elastic electric contact terminal 200 becomes horizontal.

Figure 3:
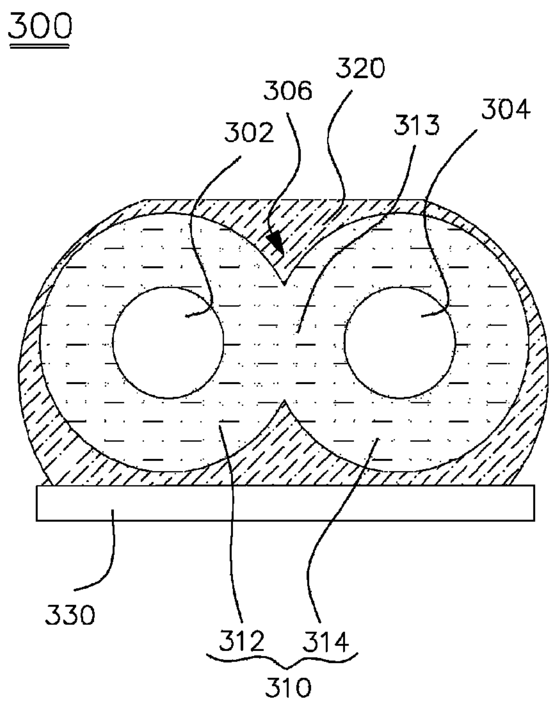
FIG. 3 is a cross-sectional view illustrating an elastic electric contact terminal according to another embodiment of the present invention.

FIG. 3 is a cross-sectional view illustrating an elastic electric contact terminal 300 according to another embodiment of the present invention.

The elastic electric contact terminal 300 includes: an elastic rubber member 310 including through holes 302 and 304 individually extending along the longitudinal direction thereof to form a dumbbell cross section; an electrically conductive elastic rubber coating layer 320 enveloping the elastic rubber member 310 to adhere thereto; and a solderable metal foil 330 adhered to the bottom surface of the elastic rubber coating layer 320.

For example, a support part 313 may include an upper recess 306 between elastic rubber elements 312 and 314, and the upper recess 306 has gentle slopes extending toward the center thereof. The elastic rubber coating layer 320 filling the upper recess 306 has a horizontal top surface, and thus, the top surface of the elastic electric contact terminal 300 is entirely horizontal to be appropriate for surface mounting using vacuum pickup.

Since the upper recess 306 is filled with a larger amount of the elastic rubber coating layer 320 than the other portions, the top of the elastic electric contact terminal 300 has increased electrical conductivity.

For example, the elastic rubber coating layer 320 is formed by curing an electrically conductive non-foaming silicone rubber liquid that is formed by adding carbon such as graphite, or metal powder such as silver or copper powder to an insulation non-foaming silicone rubber coating liquid.

For example, the elastic rubber coating layer 320 may be formed by immersing the elastic rubber member 310 in the electrically conductive non-foaming silicone rubber liquid, then vertically taking out the elastic rubber member 310, and then thermally curing the electrically conductive non-foaming silicone rubber liquid.

For example, the elastic rubber coating layer 320 may have an electric resistance of 1Ω or smaller.

The solderable metal foil 330 may be formed of copper or a copper alloy, and be plated with one of stannum, silver, and gold to resist corrosion and facilitate soldering.

The metal foil 330 and the elastic rubber coating layer 320 are adhered to each other by curing an electrically conductive non-foaming elastic rubber coating liquid forming the elastic rubber coating layer 320.

A portion of the metal foil 330 may be adhered to the elastic rubber member 310 by an elastic rubber adhesive (not shown) disposed on a portion of the bottom surface of the elastic rubber member 310, and another portion thereof may be adhered thereto by the elastic rubber coating layer 320.

That is, at least both side portions of the metal foil 330 may be adhered and electrically connected to the elastic rubber member 310 by the elastic rubber coating layer 320.

Thus, in addition to the advantages of the elastic electric contact terminals 100 and 200, the weight of the metal foil 330 facilitates reel taping, and the elastic electric contact terminal 300 is prevented from being moved by an air flow during surface mounting so as to facilitate reflow soldering.

Furthermore, the elastic electric contact terminal 300 is softer than the elastic electric contact terminals 100 and 200.

Figure 4:
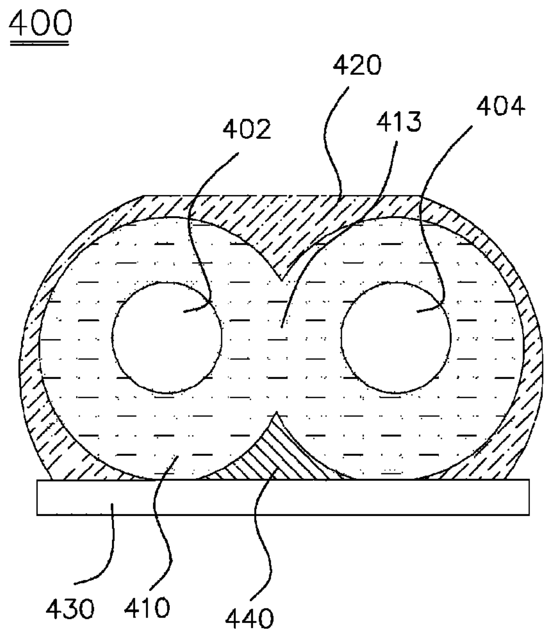
FIG. 4 is a cross-sectional view illustrating an elastic electric contact terminal as a modified example of the elastic electric contact terminal of FIG. 3 according to another embodiment of the present invention.

FIG. 4 is a cross-sectional view illustrating an elastic electric contact terminal 400 as a modified example of the elastic electric contact terminal 300 according to another embodiment of the present invention.

According to the current embodiment, an electrically conductive elastic rubber coating layer 420 has portions extending a certain length from both bottom edges of an elastic rubber member 410, and a metal foil 430 is adhered to the extended portions.

A portion of the bottom surface of the elastic rubber member 410, which is not covered with the elastic rubber coating layer 420, is filled with and adhered to an elastic rubber adhesive 440.

For example, the metal foil 430 may be attached to a portion of the bottom surface of the elastic rubber member 410 by using the elastic rubber adhesive 440, and then, the elastic rubber member 410 may be coated with the elastic rubber coating layer 420.

For example, the elastic rubber adhesive 440 may be an insulation silicone rubber adhesive having excellent adhesiveness, but is not limited thereto. Thus, when the elastic rubber member 410 is small, the elastic rubber adhesive 440 may be electrically conductive to provide working efficiency and reliable electrical conductivity.

According to the current embodiment, adhesion between the metal foil 430 and the elastic rubber member 410 is improved.

In addition, the current embodiment is appropriate for a wide elastic electric contact terminal.

As described above, an elastic electric contact terminal has a height smaller than the width thereof, in which through holes can be easily formed.

In addition, since the elastic electric contact terminal includes two or more through holes, when the elastic electric contact terminal is maximally pressed, and then, is heated, the possibility of adhesion between the top and bottom walls of an elastic rubber member defining the through holes is lower than the possibility of adhesion between the top and bottom walls of an elastic rubber member defining a single through hole.

In addition, since a plurality of the through holes is formed in the elastic rubber member, pressure applied from an object to the elastic rubber member is uniformly dispersed, and the through holes increase the entire resilient force of the elastic rubber member.

In addition, although the height of the elastic rubber member is smaller than the width thereof, a support part disposed between the through holes can sufficiently resist external vertical pressure, and provide excellent elastic resilient force.

In addition, the elastic rubber member can be easily formed to bilateral symmetric shape and size.

In addition, the elastic rubber member has a lower recess in the laterally middle bottom portion thereof to improve adhesion between the elastic rubber member and a polymer film including a metal layer, or between the elastic rubber member a metal foil.

In addition, bottom parts of the elastic rubber member, which are placed on solder cream of a printed circuit board, form a bilateral symmetric protrusion structure that is efficiently immobilized during reflow soldering, thereby improving the reliability of soldering.

In addition, the elastic rubber member has a horizontal top surface that is appropriate for reflow soldering and reel taping using vacuum pickup.

While the present invention has been described in detail, it should be understood that various changes, substitutions and alterations can be made hereto without departing from the spirit and scope of the invention as defined by the appended claims.

What is claimed is:

1. A solderable elastic electric contact terminal comprising:

an elastic core having a height smaller than a width thereof, and including two or more through holes separately disposed therein and having a dumbbell shaped cross section composed with two or more bulging regions and a recess region between every two adjacent bulging regions thereof, said recess region having an upper recess and a lower recess, wherein the through holes are formed in a longitudinal direction of the elastic core, one hole in each of said bulging regions of the elastic core;

an elastic rubber coating layer enveloping the elastic core and adhered thereto, said elastic rubber coating layer filling the upper recess of the dumbbell shaped cross section and thereby providing a planar top surface; and a heat-resistant polymer film having an inner surface adhered to the elastic rubber coating layer to envelop the elastic rubber coating layer, and an outer surface integrally formed with a metal layer, wherein a top surface of the metal layer includes a planar region for vacuum pickup.

2. The solderable elastic electric contact terminal of claim 1, wherein the elastic core comprises elastic core elements having the same shape and size, and each of said through holes are disposed at a central area of its corresponding bulging region thereof.

3. The solderable elastic electric contact terminal of claim 1, wherein the lower recess of the elastic core has a space that is not covered with the elastic rubber coating layer and the heat-resistant polymer film.

4. The solderable elastic electric contact terminal of claim 2, wherein the elastic core elements comprise bottom parts, respectively, to form a bilateral symmetric protrusion structure to contact solder cream of a printed circuit board.

5. The solderable elastic electric contact terminal of claim 1, wherein the solderable elastic electric contact terminal is used for surface mounting using vacuum pickup, and reflow soldering using solder cream.

6. The solderable elastic electric contact terminal of claim 1, wherein the elastic rubber coating layer is formed by curing a silicone rubber liquid.

7. A solderable elastic electric contact terminal comprising:

an elastic core having a height smaller than a width thereof, and including two or more through holes separately disposed therein, said elastic core having two or more bulging regions and a recess region between every two adjacent bulging regions thereof, said recess region having an upper recess and a lower recess, wherein the through holes are formed in a longitudinal direction of the elastic core, one hole in each of said bulging regions of the elastic core;

an electrically conductive elastic rubber coating layer enveloping the elastic core to adhere thereto, said electrically conductive elastic rubber coating layer filling the upper recess of the elastic core and thereby providing a planar top surface; and a metal foil adhered to a bottom surface of the electrically conductive elastic rubber coating layer by curing the electrically conductive elastic rubber coating layer.

8. The solderable elastic electric contact terminal of claim 7, wherein the electrically conductive elastic rubber coating layer is formed by curing an electrically conductive silicone rubber liquid.

9. The solderable elastic electric contact terminal of claim 7, wherein the electrically conductive elastic rubber coating layer has portions extending a certain length from both bottom edges of the elastic core, and the metal foil is adhered to the extended portions of the electrically conductive elastic rubber coating layer.

10. The solderable elastic electric contact terminal of claim 9, wherein a portion of a bottom surface of the elastic core out of the extended portions between the elastic core and the metal foil is filled with and adhered to an elastic rubber adhesive.

* * * * *